United States Patent [19]

Berger

[11] Patent Number: 4,603,266
[45] Date of Patent: Jul. 29, 1986

[54] SAMPLE AND HOLD DEVICE WITH AN MOS CAPACITOR

[75] Inventor: Jean Luc Berger, Paris, France

[73] Assignee: Thomson-CSF, Paris, France

[21] Appl. No.: 660,418

[22] Filed: Oct. 12, 1984

Related U.S. Application Data

[63] Continuation of Ser. No. 268,060, May 28, 1981, abandoned.

[30] Foreign Application Priority Data

Jun. 3, 1980 [FR] France ............................ 80 12280

[51] Int. Cl.⁴ .................... H01L 29/78; H01L 27/04; G11C 19/28; G11C 27/02
[52] U.S. Cl. .................................. 307/353; 357/23.6; 357/24
[58] Field of Search ................... 307/353, 304; 357/24, 357/23.6

[56] References Cited

U.S. PATENT DOCUMENTS

| | | | |
|---|---|---|---|
| 3,781,574 | 12/1973 | White et al. | 357/24 |
| 3,935,477 | 1/1976 | Strain et al. | 357/24 |
| 3,986,198 | 10/1976 | Kosonocky | 357/24 |
| 4,067,001 | 1/1978 | Hoffmann | 357/24 |
| 4,139,782 | 2/1979 | Ablassmeier | 357/24 |

Primary Examiner—William D. Larkins
Attorney, Agent, or Firm—Roland Plottel

[57] ABSTRACT

This device comprises a MOS transistor of the tetrode type operating under triode conditions. The storage of charges corresponding to each input voltage sample is realised beneath the MOS capacitor, whose plate is the longer insulating gate of the MOS transistor. The various gates of the transistor are half-rings with an increasing surface area. The diode connected to the input voltage of the device is placed in the center of circles defining the rings. The diode connected to the voltage follower stage supplying the output voltage of the device is positioned on the periphery of the longer insulating gate.

7 Claims, 7 Drawing Figures

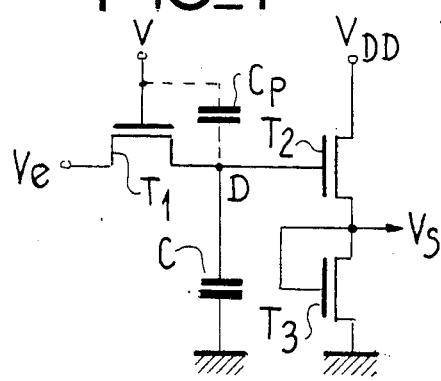
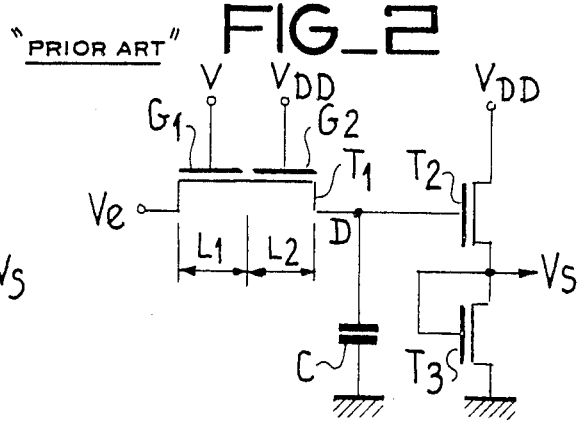
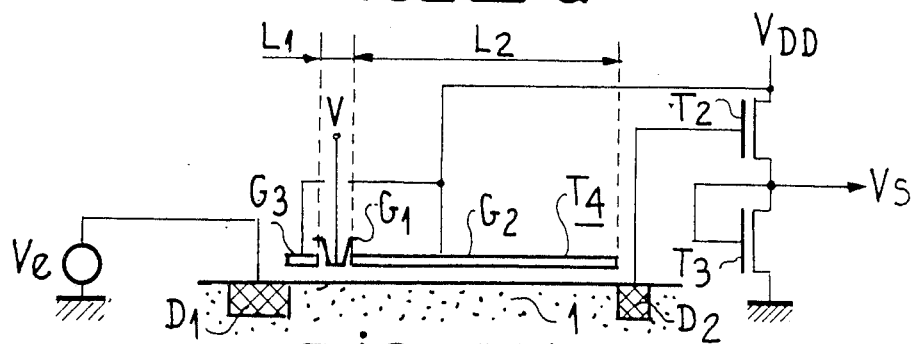
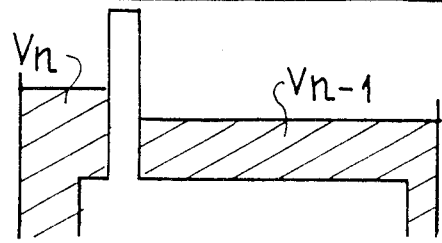
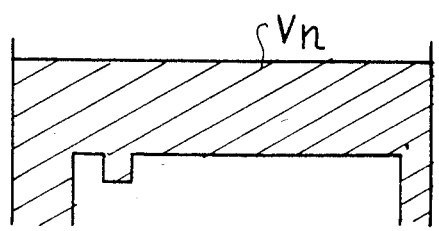

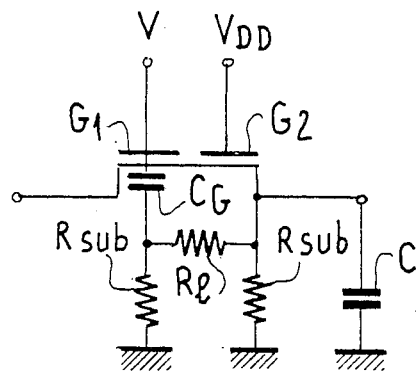
FIG_4
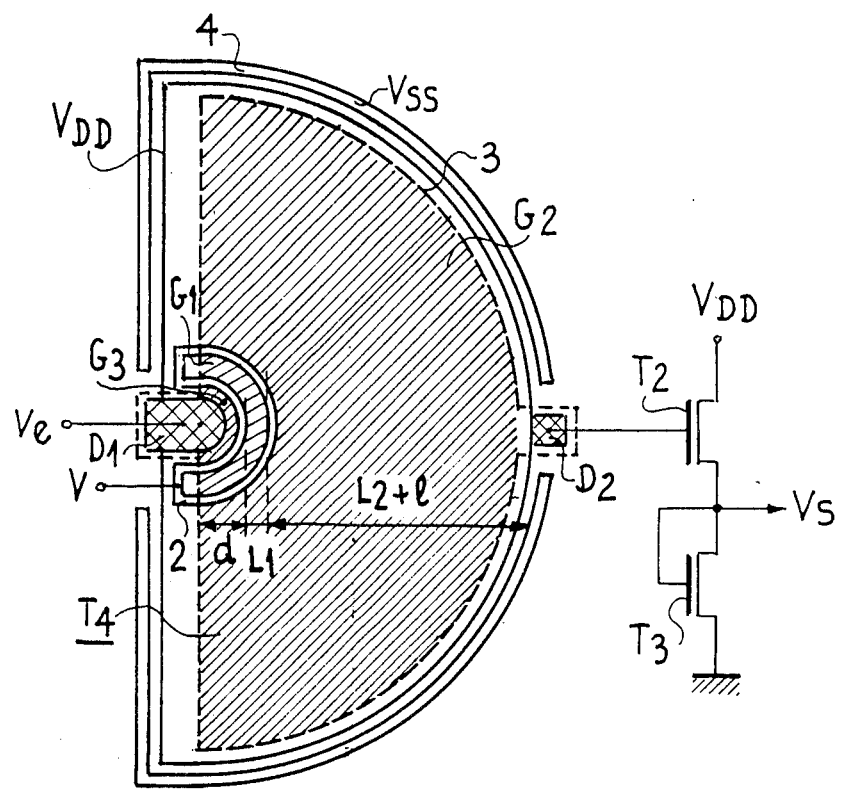
FIG_5

SAMPLE AND HOLD DEVICE WITH AN MOS CAPACITOR

This application is a continuation of application Ser. No. 268,060, Filed May 28, 1981, now abandoned.

BACKGROUND OF THE INVENTION

The present invention relates to a sample and hold device with a MOS capacitor.

The prior art essentially discloses two types of sample and hold devices which use MOS technology.

The first type of device comprises a standard MOS transistor, whose source receives the input voltage to be sampled and whose gate receives a sampling voltage. The drain of the MOS transistor is connected to a storage capacitor and to a voltage follower stage with a high input impedance, which can be constituted by two MOS transistors in series. The storage capacitor is not a MOS capacitor. It can be integrated into the semiconductor substrate in which are integrated the MOS transistors, but has two metal plates. The charges are transferred from a MOS transistor drain to the storage capacitor by a connection existing between the drain and one of the plates of the storage capacitor.

The second type of device comprises a MOS transistor having two gates. The gate which is nearest to the MOS transistor source is the sampling gate receiving the sampling voltage, and is followed by an insulating gate raised to a constant potential. The MOS transistor drain is connected, as in the previous case, to a storage capacitor, which is not a MOS capacitor, and to a voltage follower such a MOS transistor, with four electrodes is sometimes called a tetrode type MOS transistor.

The performances of sample and hold devices are essentially defined by two characteristics. One is the acquisition time of each new voltage sample taken from the input voltage of the device and which should be as short as possible. The second is the stray coupling capacitance between the sampling gate and the MOS transistor drain of the device, which should be reduced to the minimum.

Attempts to improve one of these characteristics often leads to a deterioration of the other. Thus, in the prior art sample and hold devices based on MOS technology with a conventional MOS transistor, it is necessary to increase the value of the storage capacitance to reduce the effect of the tray coupling capacitance. The disadvantage is that at the same time the acquisition time is increased.

There are three essential causes for the stray coupling capacitance. The first is the overlap between the sampling gate and the drain diffusion of the MOS transistor. The second is the coupling between the sampling gate and the MOS channel of the MOS transistor. During the passage of the sampling voltage from high level to low level, part of the carriers of the channel is restored to the source and drain diffusions. During this restoration, the drain which is a high impedance point undergoes a potential drop from $Q_c/C$, in which $Q_c$ represents the restored charge quantity and C the storage capacitance value. Conversely, during the passage of the sampling voltage from low level to high level, the drain gives charge, which raises its potential. The final cause of the stray coupling capacitance is the coupling of the sampling gate of the MOS transistor to the drain via the substrate, which does not have a zero resistance.

In the prior art sample and hold devices based on MOS technology with a MOS transistor having two gates there is no longer an overlap between the sampling gate of the transistor and its drain diffusion, due to the insulating gate. However, the coupling between the sampling gate and the MOS channel of the MOS transistor still exists. The length of the insulating gate of the MOS transistor is increased to reduce the extent of the discharge or restoration undergone by the transistor drain. The disadvantage is that the acquisition time is simultaneously increased.

Thus, with the prior art MOS sample and hold devices, it is difficult to have both a satisfactory acquisition time and a satisfactory stray coupling capacitance.

BRIEF SUMMARY OF THE INVENTION

The present invention relates to a sample and hold device with a MOS capacitor having a MOS transistor having two gates, operating in non saturated mode (sometimes known as triode operation), and in which the storage of charges corresponding to each sample of the input voltage is effected on the MOS capacitor having an insulating gate plate, the drain of the MOS being connected to a high input impedance voltage follower stage supplying the output voltage of the device.

Thus, in the device according to the invention there is no longer a storage capacitor not constituted by an MOS capacitor as in the prior art devices.

In this way, the acquisition time is reduced to the balancing time of the surface potential beneath the sampling and insulating gates with the source of the MOS transistor, which receives the input voltage. Unlike the prior art devices, the acquisition time no longer includes the time necessary for charging an external storage capacitor across an MOS transistor.

It is consequently possible to increase the length of the insulating gate so as to reduce the stray coupling capacitance between the sampling gate and the MOS transistor drain, while at the same time retain the same acquisition time as in the prior art devices.

The device according to the invention makes it possible to have simultaneously a satisfactory acquisition time and a satisfactory stray coupling capacitance.

Thus, for the sample and hold device with an MOS capacitor according to the invention, the acquisition time is equal to that of the prior art devices, while simultaneously obtaining a reduction by approximately three of the interference by coupling with the channel, a reduction by approximately 10 of the interference by coupling with the substrate and finally a reduction of approximately 1.5 in the surface area of the device.

BRIEF DESCRIPTION OF THE DRAWINGS

The invention is described in greater detail hereinafter relative to non-limitative embodiments and the attached drawings, wherein show:

FIGS. 1 and 2 the diagrams of two prior art sample and hold devices using MOS technology.

FIGS. 3a, b and c, a longitudinal sectional view of the sample and hold device with MOS capacitor according to the invention and two diagrams illustrating its operation.

FIG. 4 an equivalent circuit diagram relating to the sample and hold devices and which illustrates the coupling by the substrate.

FIG. 5 a plan view of another embodiment of the device according to the invention shown in FIG. 3a.

DETAILED DESCRIPTION OF THE PREFERRED EMBODIMENTS

In the various drawings, the same references designate the same elements but, for reasons of clarity the dimensions and proportions of the various elements have not been respected.

FIGS. 1 and 2 are the diagrams of two prior art sample and hold devices based on MOS technology.

The device of FIG. 1 comprises a conventional MOS transistor $T_1$, whose source receives an input voltage $V_e$ to be sampled. The grid receives a sampling voltage V, which periodically varies between a low level and a high level.

The drain of $T_1$ is connected at a point D to a storage capacitor C which, is not an MOS capacitor. A high input impedance voltage follower is connected to point D. The follower is conventional, and has two MOS transistors $T_2$ and $T_3$ in series between a polarization voltage $V_{DD}$ and ground. The gate of $T_2$ is connected to point D and the gate of $T_3$ is connected to the common point of two MOS transistors $T_2$ and $T_3$, where the output voltage of the $V_S$ is collected.

FIG. 1 shows in dotted line the stray coupling capacitance $C_P$ between the gate and the drain of the MOS transistor T. At point D, this capacitance introduces a spurious signal equal to:

$$V_P = \frac{C_P}{C + C_P} \cdot V,$$

It is necessary to increase the value of the storage capacitance C to reduce the effect of the stray coupling capacitance $C_P$, which increases the acquisition time.

The device shown in FIG. 2 differs from that of FIG. 1, because it has an MOS transistor that has two gates. The source receives input voltage and $V_e$ sampling gate $G_1$ receives the sampling voltage V. This gate is followed by an insulating grid $G_2$ raised to constant potential $V_{DD}$.

It is desirable to reduce the stray coupling between the sampling gate and the drain of $T_1$ and increase the length $L_2$ of gate $G_2$ and keep the width of the gate constant. However, as will be shown hereinafter, this leads to the disadvantage of increasing the acquisition time.

In both devices according to the prior art and according to the invention, the MOS transistors used operate under triode conditions i.e. in nonsaturated mode.

On ignoring the balancing time of the surface potentials beneath gates $G_1$ and $G_2$ in view of the time necessary for charging or discharging capacitor C, the potential $V_D$ of the drain of MOS transistor $T_1$ is expressed as a function of the time t by the equation:

$$V_D = V_e + \frac{2V_o \cdot V'}{V' + (2V_o - V')e^{t/\tau}}$$

with $V_o = V - V_T - V_e$, in which $V_T$ is the threshold voltage of $T_1$, $V'$ the initial potential difference between the source and drain of $T_1$ and with $\tau = C/\mu \cdot (W/L) \cdot C_{ox} \cdot V_o$, in which $\mu$ is the mobility of the carriers, $C_{ox}$ the oxide capacitance beneath the gate per surface unit and W/L the width to length ratio of the gate of $T_1$.

Thus, both for the charging and discharging of C, the potential $V_D$ tends to move exponentially towards the input voltage $V_e$ with a time constant $\tau$, which is proportional to the length L of the channel. In the case of FIG. 2, we obtain $L = L_1 + L_2$.

In order to reach 90% of $V_e$, the charging time $t_c$ and discharging time $t_d$ are as follows:

$$t_c = 2 \cdot \tau \tag{1}$$

$$t_d = 2.6 \cdot \tau \tag{2}$$

On increasing the length $L_2$ to reduce the coupling with the drain, the acquisition time is increased.

FIG. 3a is a longitudinal sectional view of a sample and hold device with an MOS capacitor in accordance with the present invention. This device has a MOS transistor $T_4$ with two gates, (i.e. a sampling gate and an insulating gate, operating in nonsaturated mode. Two diodes $D_1$ and $D_2$ are diffused into the semiconductor substrate 1, which is for example made of silicon.

Diode $D_1$ is connected to the input voltage $V_e$ and functions as the source. Diode $D_2$, which consequently serves as the drain, is connected to a high input impedance voltage follower, which can be made as in the case of FIGS. 1 and 2 by two MOS transistors $T_2$ and $T_3$ in series. This follower supplies the output voltage of device $V_S$.

Diode $D_1$ is followed by another insulating gate $G_3$, which is much shorter than the insulating gate $G_2$ and substantially of the same length as sampling gate $G_1$. Gate $G_3$ is followed by sampling gate $G_1$, which is raised to a variable potential V and insulating gate $G_2$. The gates $G_2$ and $G_3$ are raised to the same constant potential, which can be $V_{DD}$.

The two insulating gates $G_2$ and $G_3$ are generally produced by the same metal coating, so that the length $L_1$ of $G_1$ can be relatively small, e.g. approximately 3 $\mu$m. Such a short length is satisfactory for gate $G_1$, due to the presence of gate $G_3$. If $G_3$ was absent, sampling grid $G_1$ would have to be made much longer in order to compensate a possible penetration of $D_1$ beneath $G_1$.

Gates $G_1$, $G_2$ and $G_3$ are insulated from the substrate and from one another by oxide layers, which are not shown in FIG. 3a.

FIGS. 3b and 3c are diagrams illustrating the operation of the device according to the invention. They show the evolution of the surface potential in the semiconductor substrate, with the voltage V at low level in FIG. 3b and at high level in FIG. 3c. The hatched areas indicate the presence of minority carriers.

The voltages $V_{n-1}$ and $V_n$ are applied to the input of the device at two successive times $t_{n-1}$ and $t_n$.

In the device according to the invention, capacitor C is reduced to the connection between diode $D_2$ and the voltage follower stage and its value can be considered as negligible.

The time necessary for balancing the surface potential beneath the sampling gate $G_1$ and insulating gate $G_2$ with the source of the MOS transistor connected to $V_e$ has been calculated. To reach 90% of $V_e$ at the output of the device, the charging time $t_c$ and discharging time $t_d$, i.e. for increasing and decreasing the surface potential beneath $G_2$ are as follows:

$$t_c = 3.3 \cdot (L^2/\mu \cdot V) \tag{3}$$

$$t_d = 2.3 \cdot (L^2/\mu \cdot V) \tag{4}$$

By using formulas (1), (2) and (3), (4), it is possible to estimate by what length L it is possible to increase length $L_2$ of insulating gate $G_2$, while retaining the same average acquisition time $(t_c+t_d)/2$, as for the devices of FIGS. 1 and 2.

In formulas (3) and (4), we obtain $L=L_1+L_2+1$. As gate $G_3$ is constantly charged by diode $D_1$, its charging time does not have to be taken into consideration.

By setting a priori $1>L_1+L_2$ we obtain:

$$1 = \sqrt{0.82 \cdot \frac{C}{C_{ox}} \cdot \frac{V}{V_o} \cdot \frac{L_1+L_2}{W}}$$

The above result means that on considering a prior art device like that shown in FIG. 2 and have the following characteristics:
C=10pF
$C_{ox}=3 \cdot 10^{-4}$ pF/$\mu$m$^2$
$L_1=L_2=5$ $\mu$m
W=100 $\mu$m
V=12 V at high level
$V_T=2V$
$V_e=7$ V
we obtain $1=105$ $\mu$m.

Thus, a device according to the invention with a length of the insulating gate $G_2$ equal to $L_2+=5+105=110$ $\mu$m has the same acquisition time as the device of FIG. 2, whereof the length $L_2$ of the insulating gate $G_2$ is only 5 $\mu$m.

In the device according to the invention, the ratio of the lengths $L_2/L_1$ of insulating gate $G_2$ and sampling gate $G_1$ exceeds 20.

It is now possible to evaluate, for the same acquisition time, the improvement provided by the device according to the invention with respect to the stray coupling between the sampling gate and the drain of the MOS transistor.

In the case of the prior art device of FIG. 2, the stray voltage $V_P$ at point D of $T_1$, which is due to the coupling between the sampling gate and the MOS channel of $T_1$ is: $V_P=Q_c/C \cdot \frac{1}{2}$, in which $Q_c$ represents the charge quantity sampled or restored by the channel of $T_1$ beneath $G_1$ as a first approximation half on the drain and half on the source for establishing the inversion layer:

$$V_p = \frac{W \cdot L_1 \cdot C_{ox} \cdot V_o}{C} \cdot \frac{1}{2} \quad (5)$$

Another reason for the stray coupling between the sampling gate and the drain of $T_1$ is the coupling of the sampling gate $G_1$ of $T_1$ with the drain via the substrate.

FIG. 4 is a diagram illustrating this coupling. The capacitance $C_G$ regroups in series the oxide capacitance and the space charge capacitance of the sampling gate $G_1$. The resistance $R_{SUB}$ is the substrate resistance between the edge of the space charge area and the closest substrate contact, which is generally on the rear face of the device. Finally, the resistance $R_1$ is the substrate resistance between the edge of the space charge area beneath the sampling gate $G_1$ and beneath the drain.

The interference due to the coupling by the substrate decreases in proportion to $$R_{SUB} < R_1 \quad (6)$$

FIG. 5 is a plan view of another embodiment of the device according to the invention shown in FIG. 3a.

In this embodiment, the geometry of the insulating gate $G_2$ is optimum for ensuring that its capacitance is at a maximum, making it possible to reduce interference due to coupling of the sampling gate with the channel, while retaining a constant acquisition time.

In this embodiment, the gates $G_3$, $G_1$ and $G_2$ of FIG. 3a are constituted by ring sectors having an increasing surface area and having the same angle at the center. In FIG. 5, the center angle $\alpha=180°$ and the gates are half-rings, the center angle being such that $0<\alpha \leq 180°$.

In FIG. 5, gates $G_1$, $G_2$ and $G_3$ are hatched for reasons of clarity.

Diode $D_1$ is positioned at the center of circles determining the rings. Its end, which is enclosed by gate $G_3$, is also in the form of a circular arc. Diode $D_2$ is placed at a random point of the largest diameter circle, i.e. on the periphery of gate $G_2$. The sampling grid $G_1$ is on a metal coating level superimposed on that carrying gates $G_2$ and $G_3$. Gate $G_1$ is insulated from gates $G_2$ and $G_3$ by an insulating layer 2. Sampling gate $G_1$ has an internal radius equal to d and an external radius equal to $d+L_1$. The insulating gate $G_2$ has an internal radius equal to $d+L_1$ and an external radius equal to $d+L_1+L_2+1$.

An insulating diffusion 3, which is semicircular apart from the breaks required by diodes $D_1$ and $D_2$, determines the useful area of the substrate. The insulating diffusion 3 is symbolically shown by broken lines in the drawing.

In this configuration, the charges from $D_1$ all have to travel the same distance to reach the periphery of $G_2$, whose surface potential is read by diode $D_2$. Thus, the acquisition time remains constant.

It should be noted that the actual sampling interference has the same acquisition time as the signal in order to reach diode $D_2$. Thus, it is filtered by the channel beneath the gates of MOS transistor $T_2$, whose equivalent circuit diagram is similar to a system of resistors in series charged by capacitors.

The quantity of charges $Q_c$ sampled or restored by the channel of $T_2$ beneath $G_1$ for establishing the inversion layer is written:

$$Q_c = \text{surface of } G_1 \cdot C_{ox} \cdot V_o = \alpha/2 L_1 \cdot (2d+L_1) \cdot C_{ox} \cdot V_o$$

It is known that the expression of the surface potential $\phi_S$ as a function of the inversion charge density Q is:

$$\frac{\Delta \phi_S}{\Delta Q} = \frac{\gamma}{C_{ox}},$$

in which $\gamma$ is a coefficient between 0.7 and 1, dependent on the doping of the substrate and the oxide thickness.

Thus, the interfering voltage $V_P{}^*$ introduced at the level of $D_2$ and which is due to the coupling by the channel:

$$V_p{}^* = \frac{\gamma}{C_{ox}} \cdot \frac{1}{\text{surface of } G_2} \cdot \frac{Q_c}{2} \quad (7)$$

$$V_p{}^* = \gamma \cdot \frac{\text{surface of } G_1}{\text{surface of } G_2} \cdot \frac{V_o}{2} =$$

$$\gamma \cdot \frac{L_1 \cdot (2d+L_1)}{L_2 \cdot (2d+2L_1+L_2)} \cdot \frac{V_o}{2}$$

Thus, in the device according to the invention, the extent of the interference by coupling with the channel is proportional to the ratio of the surfaces of gates $G_1$ and $G_2$.

The configuration used in FIG. 5 corresponds to a smaller ratio than in the configurations where $G_1$ and $G_2$ are rectangular for a given semiconductor surface.

It is also apparent that the surface ratio does not depend on the center angle $\alpha$. The angle $\alpha$ has been limited to 180°, because beyond this it is necessary to modify diode $D_1$ and the necessary silicon surface is increased.

In order to evaluate the improvement provided for the same acquisition time by the device according to the invention with respect to the stray coupling by the channel, it is possible to write the ratio:

$$\frac{V_p}{V_p^*} = \frac{(5)}{(7)} = \frac{C_{ox} \cdot W \cdot L_2}{\gamma \cdot C} \cdot \frac{L_2 \cdot (2d + 2L_1 + L_2)}{(2d + L_1)}$$

By using the previously obtained value: $L_1 = 5$ μm and $L_2 = 110$ μm and by adopting $\gamma = 0.85$ and $d = 5$ μm we obtain: $V_P/V_P^* = 3.4$.

Thus, the interference by coupling with the channel is reduced by approximately three.

With regards to the interference due to coupling by the substrate, the removal of the sampling gate $G_1$ from diode $D_2$ helps to increase $R_1$ (see equation (6)).

In addition, there is contact between the front face of the device and substrate 4, which is raised to the reference potential $V_{SS}$. In FIG. 5, this contact is semicircular, apart from the breaks required by diodes $D_1$ and $D_2$. Therefore, the contacts with the substrate can be moved to within 10 μm of $G_1$ and $G_2$, so that the resistance $R_{SUB}$ is at a minimum.

The device according to the invention makes it possible to reduce approximately by 10 the interference by coupling with the substrate.

Finally, a final advantage of the device according to the invention is the space saving obtained compared with the prior art.

The storage capacitor of the device according to the invention is constituted by the MOS capacitor, whose plate is the insulating gate $G_2$. In the case of the numerical example chosen, this capacitance equals:

$$C_o \cdot \pi/2 \ (2d + 2L_1 + L_2 + 1) \cdot (L_2 + 1) = 6.7 \ pF$$

The storage capacitance C of a prior art device is 10 pF, leading to a surface gain of 1.5 if the capacitor is produced with oxide of the same thickness gate $G_2$.

What is claimed is:

1. A sample and hold device constituted by a MOS transistor comprising in series a first diode, which functions as a source electrode, connected to an input voltage of the device, a sampling gate connected to a variable potential, an insulating gate connected to a constant potential, and a second diode, which functions as a drain electrode, adjacent to the insulating gate, said second diode is connected to a high input impedance voltage follower supplying the output voltage of the device, the length of the insulating gate is greater than the length of the sampling gate, and charges corresponding to each sample of the input voltage are stored in a MOS capacitor within said MOS transistor having the insulating gate as a plate of said capacitor.

2. A device according to claim 1, wherein the ratio of the lengths of the insulating gate and the sampling gate exceeds 20.

3. A device according to claim 1 wherein the second insulating gate, the sampling gate and the first insulating gate are ring sectors with an increasing surface area and with the same center angle, the first diode being positioned at the center of circles defining the rings, and the second diode being positioned at a random point on the periphery of the first insulating gate.

4. A device according to claim 3, wherein the center angle of the ring sectors does not exceed 180°.

5. A device according to claim 3, wherein a contact with the substrate is provided by the front face of the device and essentially surrounds the complete device.

6. A device according to claim 2, wherein the insulating gate and the sampling gate have the same widths.

7. A device according to claim 1, wherein the insulating gate is connected to a second insulating gate which is located between the first diode and the sampling gate, said second insulating gate being shorter than than the first insulating gate.

* * * * *